United States Patent
Doty et al.

(10) Patent No.: US 8,071,171 B1
(45) Date of Patent: Dec. 6, 2011

(54) METHODS FOR CREATING SPATIALLY CONTROLLED COMPOSITE MATERIALS

(75) Inventors: Robert E. Doty, Los Angeles, CA (US); Geoffrey P. McKnight, Los Angeles, CA (US); Guillermo A. Herrera, Winnetka, CA (US); David L. Hammon, Simi Valley, CA (US)

(73) Assignee: HRL Laboratories, LLC, Malibu, CA (US)

( * ) Notice: Subject to any disclaimer, the term of this patent is extended or adjusted under 35 U.S.C. 154(b) by 1083 days.

(21) Appl. No.: 11/974,134

(22) Filed: Oct. 10, 2007

(51) Int. Cl.
  *B05D 5/00* (2006.01)
(52) U.S. Cl. ........ 427/272; 427/275; 427/307; 427/309; 427/327; 427/384; 427/409; 427/410; 428/457
(58) Field of Classification Search .................. 427/133, 427/135, 271, 272, 258, 487–521, 307, 309, 427/409–410, 327; 216/39, 7, 35; 428/457–458; 156/182
  See application file for complete search history.

(56) References Cited

U.S. PATENT DOCUMENTS 7,550,189 B1 * 6/2009 McKnight et al. ............ 428/116

OTHER PUBLICATIONS

Lake et al., *The Fundamentals of Designing Deployable Structures with Elastic Memory Composites*, AIAA 2002-1454, Apr. 2002, 14 sheets.

* cited by examiner

*Primary Examiner* — Frederick Parker
*Assistant Examiner* — Alex Rolland
(74) *Attorney, Agent, or Firm* — Christie, Parker, Hale (57) ABSTRACT

Methods and systems for controlling a three(3)-dimensional distribution of structural reinforcement elements in a polymer-matrix composite. One embodiment of the invention provides a method that includes adding and curing a shape memory polymer in a plurality of flexible preforms attached with each other after preforming each of the flexible preforms to form a spatially controlled preform and variable stiffness material composite laminate. Here, in this embodiment, at least one of the preforms includes a flexible support formed from a patterned supporting material on a first surface of a stiff-structural sheet and the stiff-structural sheet that has been patterned on the support.

19 Claims, 8 Drawing Sheets
(8 of 8 Drawing Sheet(s) Filed in Color)

METHODS FOR CREATING SPATIALLY CONTROLLED COMPOSITE MATERIALS

CROSS-REFERENCE TO RELATED APPLICATION(S)

This application contains subject matter that is related to U.S. patent application Ser. No. 11/193,148, now U.S. Pat. No. 7,550,189 entitled "VARIABLE STIFFNESS STRUCTURE," the entire content of which is incorporated herein by reference.

FIELD OF THE INVENTION

The invention relates generally to variable stiffness materials, and, more particularly, to methods and systems for controlling a three(3)-dimensional distribution of structural reinforcement elements in a polymer-matrix composite.

BACKGROUND OF THE INVENTION

Over the last several years, significant interest has built up over the use of variable geometry structures to improve performance of vehicles and sub-components. Reconfigurable or morphing structure technology, which permits structural components to undergo large-scale, in-service changes in component geometry, could provide game-changing performance enhancements over broad operating conditions. The benefits of this technology include high performance components, improved and optimized wave interactions (EM, shock, sound, air flow), and deployable systems. Applications that may benefit from such a capability are those needing aerodynamic optimization (such as airplane wings), control surfaces, inlets/outlets, tunable EM surfaces (such as reflectors, antennas, gratings, mirrors) and deployable structures. Existing static shape structures have evolved to be very mass efficient by using exterior panels and surfaces to provide torsional stability and enhanced bending stiffness as in the typical box wing design used for aircraft. In order to preserve this high structural performance in reconfigurable systems, new materials are required which can both accommodate large deformations necessary to achieve performance gains in the component itself, and sustain a large working stiffness which is necessary to retain structural efficiency and low weight.

Figure 1:
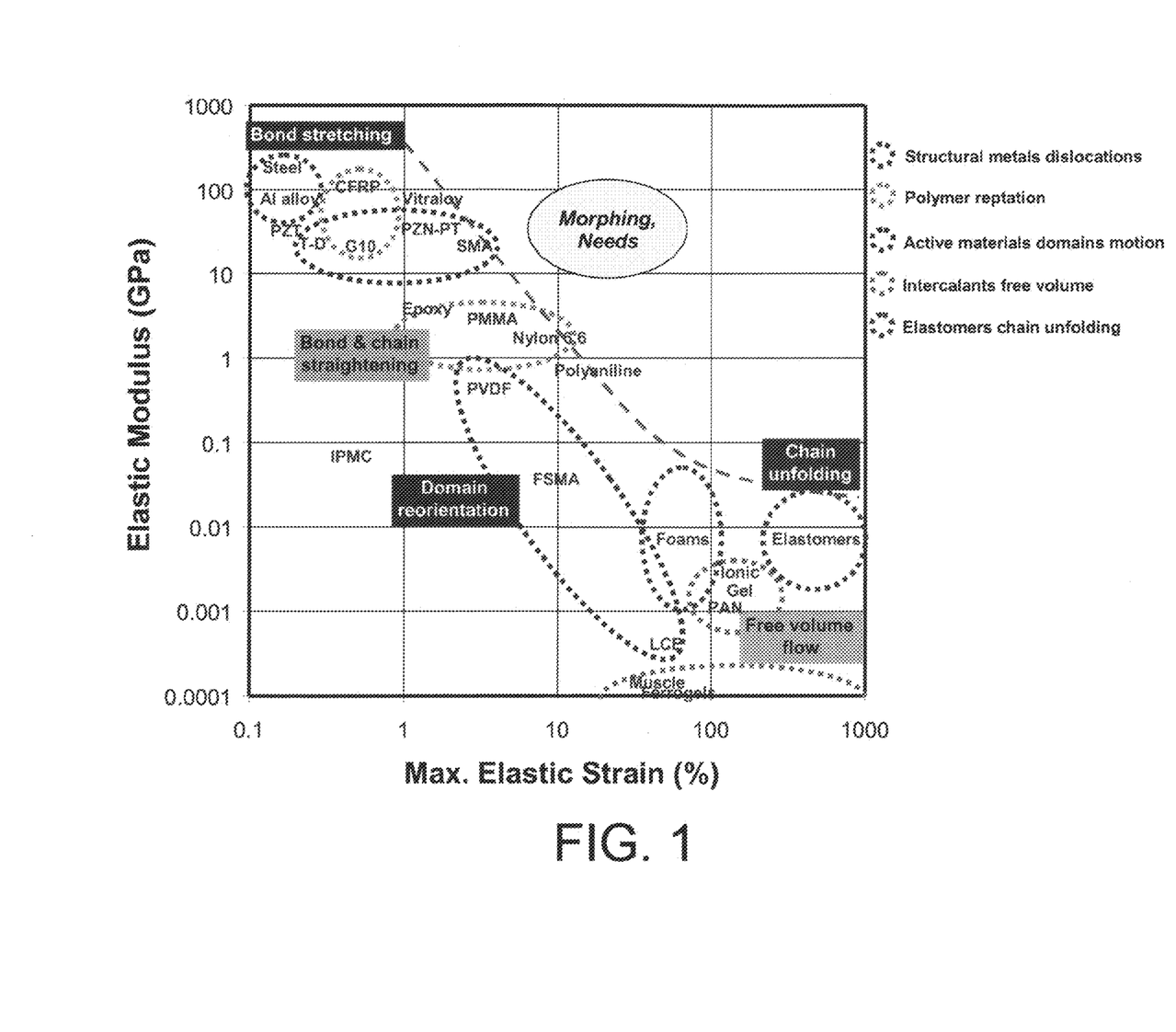
FIG. 1 is a graph surveying material properties for morphing applications based on intrinsic modulus and reversible elastic strain.

FIG. 1 is a graph surveying material properties for morphing applications based on intrinsic modulus and reversible elastic strain.

As shown in FIG. 1, various thresholds exist for combinations of strain and stiffness in available materials to build morphing systems. Each of these thresholds is related to the intrinsic mechanism of the material's strength and/or strain reversibility. Traditional structural materials such as metallic alloys and fibrous composites largely obtain their strength from atomic bonding and large deformations only though irreversible dislocation motion. Traditional active materials, based on phase change mechanisms, generally provide large stiffness but are limited in reversible strain magnitude by the relatively small changes in lattice supported by phase changes. Polymers, generally accommodating deformation through reputation (i.e., creep), cannot generally decouple the deformation and stiffness mechanisms and thus result in tradeoff of reversible strain and stiffness that does not provide enough stiffness for structural reconfiguration. Elastomers reside at the far end of the polymer spectrum, providing significant deformation capability through polymer chain unfolding mechanisms, but with very low stiffness that result in significant penalties to structural efficiency.

Given the lack of available constant stiffness materials for morphing applications, variable stiffness materials would be very useful in improving morphing capabilities. Variable stiffness materials potentially can be operated at high stiffness, appropriate for structural efficiency, and operated at low stiffness where large deformations without minimal mechanical energy input can be achieved.

As such, there is a need for variable stiffness materials that can be stiffened and softened with ease, and, more particularly, a polymer-matrix composite or laminate of structural reinforcement elements (constant stiffness component) and a thermosetting polymer (variable stiffness component) to provide exemplary variable stiffness material (VSM) structures. Such structures allow a softened state (or mode) to achieve large reversible deformation with relatively small input energy while maintaining high stiffness in a structural mode. The stiffness and reversible strain of a segmented composite are largely determined by geometrical and spatial variables. For example, the composite stiffness varies with the aspect ratio of the reinforcement segments and with the volume fraction of the stiff component in the overall composite. The maximum reversible strain is limited by the capacity of the matrix material to reversibly accommodate the local shear strain which is a function of the length of the reinforcement segments and the interlaminar spacing (matrix layer thickness). Furthermore, modeling and experiment have shown that the low temperature storage modulus of the VSM composite is sensitive to the gap size, or edge-to-edge distance between reinforcement segments. In order to tailor the properties of the composite to different application requirements, it is desirable to provide a system and method for precisely controlling a three-dimensional distribution of the structural reinforcement elements in the polymer-matrix composite.

SUMMARY OF THE INVENTION

Aspects of embodiments of the invention are directed to a system and method for precisely controlling the three(3)-dimensional distribution of structural reinforcement elements in a polymer-matrix composite.

In one embodiment, the precise control of features at the microscale allows a manipulation of stress and strains in the composite components, thereby achieving high performance multifunctional materials. While an exemplary embodiment of the invention is directed to mechanically variable stiffness materials, other materials which rely on the phenomenon of spatial distribution such as contact/pressure sensing and wave interaction (EM/pressure/sound) could also benefit from design and fabrication of precisely controlled composite microstructures.

For variable stiffness composites, a composite microstructure according to an embodiment of the invention is a laminate composed of alternating layers of a stiff-structural material such as (but not limited to) steel or aluminum, and a shape memory polymer or other similar polymer such as epoxy, vinyl ester or polyester variants. The shape memory polymer can be of the thermoplastic or thermoset type. In one embodiment, the shape memory polymer is of the thermoset type. The thermoset shape memory polymer precursor is a liquid mixture of resin and curing agent, and can be applied via wet lay-up or infusion methods.

In one embodiment, the 3D spatially controlled structural reinforcement is composed of an array of metal platelets whose 2-dimensional (planar) spatial arrangement is maintained by their attachment to a flexible, permeable polymer mesh as the stiff-structural material preform layers and infused thermoset shape memory polymer as the matrix material. Multiple layers of this planar preform are stacked vertically and infused with polymer resin, control over the spatial distribution of the platelets in three (3) dimensions is achieved in the resulting composite material.

More specifically, in an embodiment of the present invention, a method for fabricating a spatially controlled preform and variable stiffness material composite laminate is provided. The method includes: adding and curing a shape memory polymer in a plurality of flexible preforms attached with each other after preforming each of the flexible preforms to form the spatially controlled preform and variable stiffness material composite laminate. The preforming of at least one of the flexible preforms includes: applying a supporting material to a first surface of a stiff-structural sheet; patterning the supporting material applied to the first surface of the stiff-structural sheet; forming a flexible support on the first surface of the stiff-structural sheet from the patterned supporting material; patterning a second surface of the stiff-structural layer, the second surface facing away from the first surface; and forming the at least one of the flexible preforms from the patterned stiff-structural sheet on the formed support.

In one embodiment, the patterning the second surface of the metal layer includes: applying a photoresist etch mask on the second surface of the stiff-structural layer to cover a plurality of covered regions on the second surface of the stiff-structural sheet and to expose a plurality of exposed regions on the second surface of the stiff-structural sheet; and etching out the exposed regions on the second surface of the stiff-structural sheet from the second surface of the stiff-structural sheet to the first surface of the stiff-structural sheet. The etching out the exposed regions may include forming a plurality of reinforcement platelets on the formed support from the etched out stiff-structural sheet. The method for fabricating the spatially controlled preform and variable stiffness material composite may further include controlling a precise three-dimensional distribution of the reinforcement platelets distributed in the spatially controlled preform and variable stiffness material composite laminate through the formed support.

In one embodiment, the applying the supporting material to the first surface of the stiff-structural sheet includes applying a photo-patternable elastomer to the first surface of the stiff-structural sheet. The patterning the supporting material applied to the first surface of the stiff-structural sheet may include exposing the applied photo-patternable elastomer to a light through a mask to cure selected regions of the elastomer. The forming the flexible support on the first surface of the stiff-structural sheet from the patterned supporting material may include removing uncured regions of the elastomer.

In one embodiment, the forming the flexible support on the first surface of the stiff-structural sheet includes forming a thin elastomer mesh on the first surface of the stiff-structural sheet from the patterned supporting material.

In one embodiment, the adding and curing the shape memory polymer in the plurality of flexible preforms includes adding and curing a thermosetting material in the plurality of flexible preforms attached with each other.

In one embodiment, the adding and curing the shape memory polymer in the plurality of flexible preforms includes concurrently curing the shape memory polymer in the plurality of flexible preforms to ensure a proper adherence of the shape memory polymer to the plurality of flexible preforms.

In one embodiment, the plurality of flexible preforms includes at least three layers of flexible preforms.

In one embodiment, the stiff-structural sheet includes a constant stiffness material.

In one embodiment, the stiff-structural sheet is a metal sheet. The metal sheet may include a material selected from the group consisting of aluminum, steel, titanium, and combinations thereof.

In one embodiment, the shape memory polymer includes a material selected from the group consisting of epoxy, vinyl ester, polyester, polyester variants, and combinations thereof.

Another embodiment of the present invention provides a method for fabricating a spatially controlled preform and variable stiffness material composite laminate that includes adding and curing a thermosetting material in a plurality of flexible preforms attached with each other after preforming each of the flexible preforms to form the spatially controlled preform and variable stiffness material composite laminate. Here, the preforming of at least one of the flexible preforms includes: applying an elastomer to a first surface of a metal sheet; patterning the elastomer applied to the first surface of the metal sheet; forming a support mesh on the first surface of the metal sheet from the patterned elastomer; patterning a second surface of the metal layer, the second surface facing away from the first surface; and forming the at least one of the flexible preforms from the patterned metal sheet on the formed support mesh.

In one embodiment, the method for fabricating of the spatially controlled preform and variable stiffness material composite further includes controlling a precise three-dimensional distribution of the patterned metal sheet distributed in the spatially controlled preform and variable stiffness material composite laminate through the formed support mesh In one embodiment, the applying the elastomer to the first surface of the stiff-structural sheet includes applying an ultraviolet-curable adhesive monomer to the first surface of the stiff-structural sheet. The patterning the supporting material applied to the first surface of the stiff-structural sheet may include exposing the ultraviolet-curable adhesive to a collimated ultraviolet light through a mask, having a mesh pattern, to cure and polymerize selected regions of the monomer.

Another embodiment of the present invention provides a system for fabricating of a spatially controlled preform and variable stiffness material composite laminate using mechanisms that infiltrate and cure a shape memory polymer in a plurality of flexible preforms attached with each other after preforming each of the flexible preforms to form a spatially controlled preform and variable stiffness material composite laminate. Here, at least one of the preforms includes a flexible support formed from a patterned supporting material on a first surface of a stiff-structural sheet and the stiff-structural sheet that is patterned on the formed support.

A more complete understanding for creating the spatially controlled composite materials will be afforded to those skilled in the art, as well as a realization of additional advantages and objects thereof, by a consideration of the following detailed description. Reference will be made to the appended sheets of drawings, which will first be described briefly.

BRIEF DESCRIPTION OF THE DRAWINGS

The accompanying drawings, together with the specification, illustrate exemplary embodiments of the present invention, and, together with the description, serve to explain the principles of the present invention.

The patent or application file contains at least one drawing/picture executed in color. Copies of this patent or patent application publication with color drawing/picture(s) will be provided by the Office upon request and payment of the necessary fee.

FIGS. 5A and 5B illustrate a process flow for fabrication of multifunctional composite laminate in which

DETAILED DESCRIPTION

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive.

Embodiments of the present invention relate to a system and method for precisely controlling the three(3)-dimensional distribution of structural reinforcement elements in a polymer-matrix composite.

In one embodiment, the precise control of features at the microscale allows a manipulation of stress and strains in the composite components, which is critical to achieving high performance multifunctional materials. While an exemplary embodiment of the invention is directed to mechanically variable stiffness materials, other materials which rely on the phenomenon of spatial distribution such as contact/pressure sensing and wave interaction (EM/pressure/sound) could also benefit from design and fabrication of precisely controlled composite microstructures. Mechanically optimized microstructures have been demonstrated as an important element to create variable stiffness materials for use in morphing structures.

For variable stiffness composites, a composite microstructure according to an embodiment of the invention is a laminate composed of alternating layers of a stiff-structural material such as (but not limited to) steel, aluminum or titanium, and a shape memory polymer or other similar polymer such as epoxy, vinyl ester or polyester variants. The shape memory polymer can be of the thermoplastic or thermoset type. In one embodiment, the shape memory polymer is of the thermoset type. The thermoset shape memory polymer precursor is a liquid mixture of resin and curing agent, and can be applied via wet lay-up or infusion methods.

Several methods have been identified and are described in more detail below that enable high volume manufacturing of the aforementioned process. One embodiment of the 3D spatially controlled structural reinforcement is composed of an array of metal platelets whose 2-dimensional (planar) spatial arrangement is maintained by their attachment to a flexible, permeable polymer mesh as the stiff-structural material preform layers and infused thermoset shape memory polymer as the matrix material. The method for making same is described herein. Multiple layers of this planar preform are stacked vertically and infused with polymer resin; control over the spatial distribution of the platelets in 3 dimensions is achieved in the resulting composite material.

An embodiment of the invention enables manufacturing of a variable stiffness material (VSM) using thermosetting polymer matrices rather than thermoplastic matrices. This embodiment of the invention allows for the use of traditional composite making techniques (RTM, VARTM, wet layup, automated tape placement, etc.) in the making of laminates that require precise control of the location and spacing of the reinforcement elements as is the case of the VSM composite, but also for other multifunctional structural materials that may benefit from this technique in current applications and in the future.

An embodiment of the invention represents an improvement over traditional fiber based composite processing techniques, where only the gross macro scale properties were controllable, and local scale geometric variations in the spatial relationship between reinforcement and matrix vary widely. This embodiment of invention enables the precise control of reinforcement placement for generic multifunctional composite purposes. Applications that might use this embodiment of the invention include integrated sensing and health monitoring applications, integrated local electronics and processing, integrated thermal control elements, and integrated precisely localized drug/stimulus/signal delivery and others.

Figure 2A:
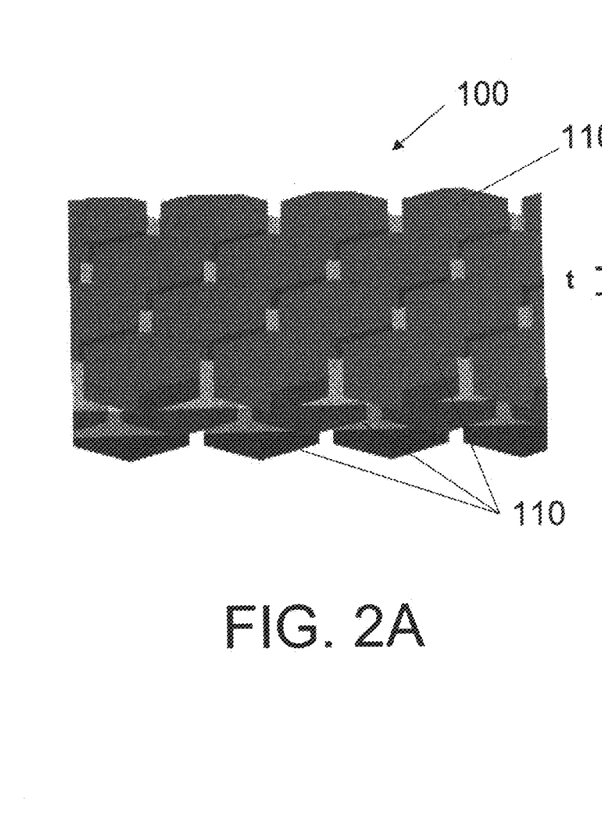
FIGS. 2A and 2B respectively are schematics of a top surface and a cross-section of a composite that is composed of three layers of reinforcement platelets in a thermosetting polymer matrix pursuant to aspects of the invention.
Figure 2B:
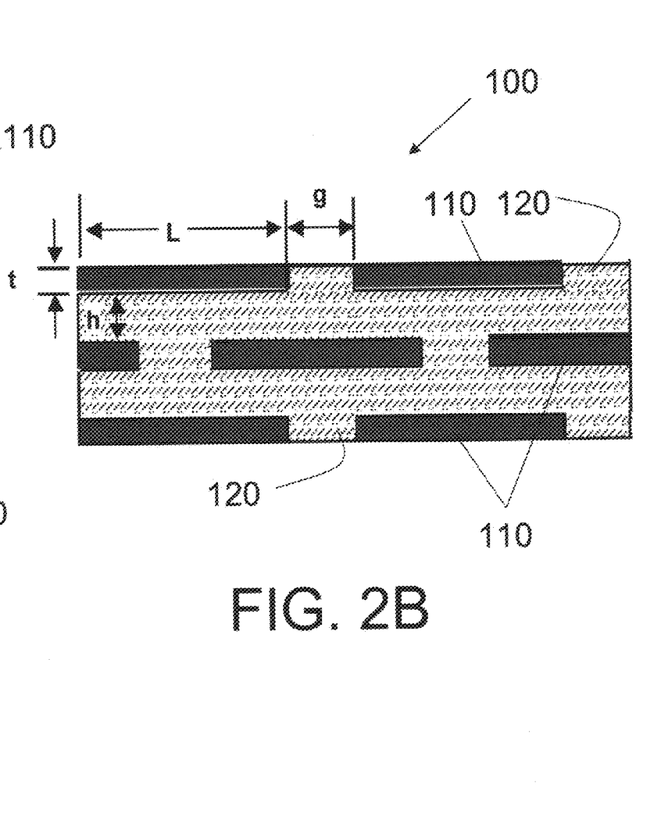

FIGS. 2A and 2B respectively are a perspective view of a top surface view and a cross-sectional view of a simplified illustration of a VSM (or VSM structure) 100 in accordance with an embodiment of the present invention. As shown in FIGS. 2A and 2B, the VSM 100 includes structural reinforcement elements (constant stiffness components) 110 distributed (or laminated) in a thermosetting polymer matrix (variable stiffness components) 120. The VSM 100 is a structure whose elastic stiffness in bending and/or axial/compression loading may be adjusted when required by applying, exposing, or otherwise subjecting the structure to appropriate control conditions (i.e. thermal, electrical, magnetic, chemical, electromagnetic, etc.). In one embodiment as shown in FIG. 2B, the structural reinforcement elements (or layers) 110 and the thermosetting polymers (or layers) 120 are arranged in alternating layers.

In assembling a VSM composed of two or more materials, the VSM may be arranged such that the materials form the layers of a laminated stack, with the two or more materials alternating in sequence. One material is of constant stiffness and is selected to provide the load bearing capabilities and also significant elastically reversible strain. The other material is selected to provide a large change in modulus (or stiffness) in response to a control signal and sustain significant shear deformation. Using a rule of mixtures as a simple model, the modulus in both the stiffest state and most compliant state of a VSM structure can be approximated. From this approximation, it is observed that a large change in effective material modulus may be obtained by increasing the number of layers.

In addition, the variable modulus layer according to certain embodiments of the present invention may take many forms, including materials that change properties based on electrical, magnetic, and/or thermal fields. The function of this layer is to alternately connect and disconnect the elastic layers mechanically so that either stress is transferred from one layer to the next or not. The effect of this connection/disconnection is to alter the stiffness of the material significantly. This results from cubic dependence of bending stiffness on thickness as discussed in McKnight, G., Doty, R., Herrera, G., and Henry, C., "BILL ARMSTRONG MEMORIAL SESSION: ELASTIC MODULUS AND STRAIN RECOVERY TESTING OF VARIABLE STIFFNESS COMPOSITES FOR STRUCTURAL RECONFIGURATION APPLICATIONS," Smart Structures and Materials, Proceedings of SPIE Vol. 6526-41, 2007, the entire content of which is incorporated herein by reference. Suitable materials should exhibit a large reversible change in intrinsic modulus or shear modulus and this effect should take place over as great a strain range as possible.

Embodiments of the present invention can be applied to many types of structural components where it is desired to alter the shape of the component. This could include reconfigurable surfaces, structural members such as beams and trusses, and others. Reconfiguration can enable many types of new functionality not currently available in structures and systems. These include performance optimization over broad operation conditions (e.g., a jet inlet nozzle that can have a quiet shape for take-off and a performance shape for cruising), enable multiple functions from a single system, optimize interaction with wave phenomenon, change in surface appearance or texture, etc. In particular, the structures and materials provided by embodiments of the present invention enable a new magnitude of deformation and stiffness in a structural component that is not achievable with non-variable stiffness materials. Components suitable for morphing of shape include surfaces, struts, springs, box frames, stringers, beams, torsion members, etc.

An embodiment of the present invention described in more detail below allows for the use of traditional composite manufacturing methods using thermosetting matrix materials.

Further, the method of creating structured elements on a flexible, permeable mesh has potential applications in multifunctional materials that go beyond structural composites.

Embodiments of the present invention improve various prior methods of making thermoset polymer-matrix composites. These prior methods include reinforcement of the matrix by natural or engineered synthetic fibers, or by fillers (particles or flakes), which are either mixed into the resin prior to lay-up or casting, or are created in-situ through a chemical (e.g. sol-gel) process. The disadvantage shared by these methods is the lack of precise control over the orientation of the reinforcement elements and the spatial relationship between reinforcement and matrix. Also, these prior methods either lack the spatial control of the reinforcement materials in at least one dimension (typical fiber and platelet composite processing approaches) or lack scalability of the manufacturing process (MEMS type).

An embodiment of the present invention enables the creation of composite structures, using thermosetting polymer resins, with 3-dimensional control of the spacing, position and orientation of the reinforcement elements, as embodied by the composite laminate shown in FIGS. 2A and 2B.

In the example VSM (or VSM structure or VSM composite) 100, the structural reinforcement elements (constant stiffness component layers) 110 are shown to be composed of an array of reinforcement platelets of uniform size, shape and orientation that are distributed in the polymer matrix 120. However, the present invention is not thereby limited. For example, as shown by the metal reinforced laminate of FIG. 8, the plates are arrayed in a herringbone-type pattern, and the unit cell of which is a pair of platelets differ in size, shape and orientation from each other.

Here, in FIGS. 2A and 2B, if the important geometric parameters, such as platelet thickness (t), and length (L), planar distance between platelets (g) and polymer layer thickness (h), are known and controllable, the mechanical properties of the composite can be tailored to specific application requirements. For example, assuming that the reinforcement elements 110 are a higher modulus, stiffer material than the matrix 120, then the overall stiffness of the VSM composite 100 will increase as the ratio (t/h) increases, or as (g/L) decreases, as both of these cases result in a higher volume fraction of the stiffer material in the composite 100.

Figure 3:
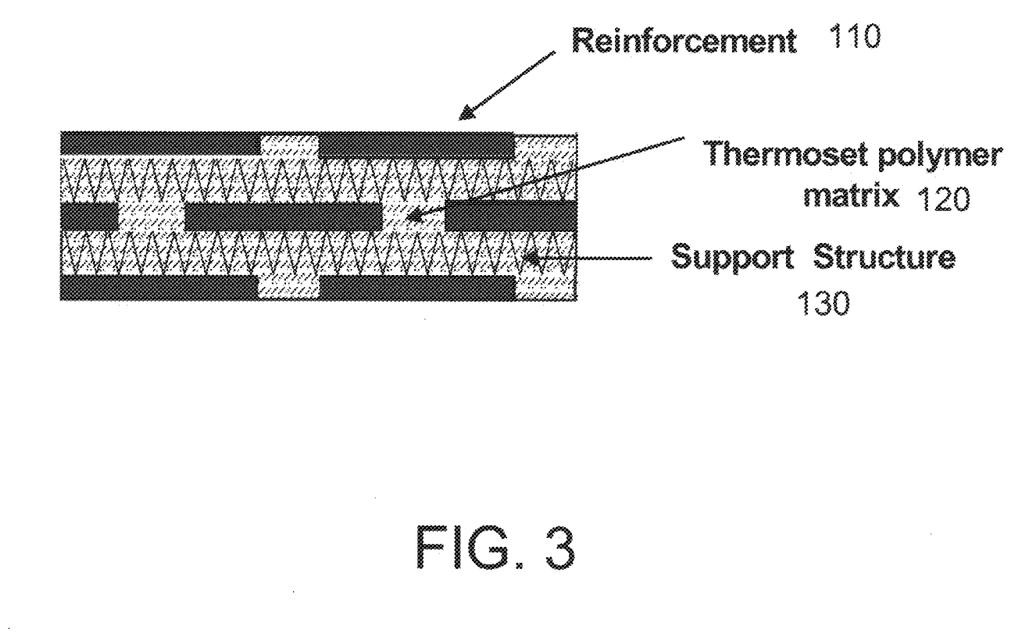
FIG. 3 is cross-section schematic of a composite showing a representation of the support structure which maintains control of the spatial distribution of the reinforcement elements prior to solidification of the polymer matrix pursuant to aspects of the invention.

FIG. 3 is a cross-section view of an idealized composite showing a representation of a support structure which maintains control of the spatial distribution of reinforcement elements prior to solidification of polymer matrix.

Referring to FIG. 3, in one embodiment of the present invention, a composite-making process uses a liquid thermosetting resin as the basis for the polymer matrix 120. To ensure that the liquid thermosetting resin are cured with the reinforcement elements (or platelets) 110 at substantially the same time to thereby ensure that the polymer matrix 120 are properly bonded to the reinforcement elements (or platelets) 120, the reinforcement elements (or platelets) 110 according to an embodiment of the present invention are created on an intermediate support structure 130 which is capable of adhering to the platelets and maintaining their orientation (e.g., planarity and direction) and spacing, and which can be embedded in the finished composite without compromising its mechanical, thermal or other properties. In one embodiment, the intermediate support structure 130 is composed of a mesh that also provides spacing between laminated layers through the thickness of the composite 100. A key consideration regarding the mesh is that the volume fraction and mechanical properties of the support structure 130 should be designed to have the least impact possible on the intended composite properties. In many cases, this implies the minimization of the elastic contribution of the support structure achieved by minimizing the volume fraction of the support structure 130. However, in some embodiments, it may be desired to use the support structure 130 for a functional purpose and thus other properties may be controlled/tailored. Embodiments of the present invention are directed to such a support structure and methods for making same.

Figure 4:
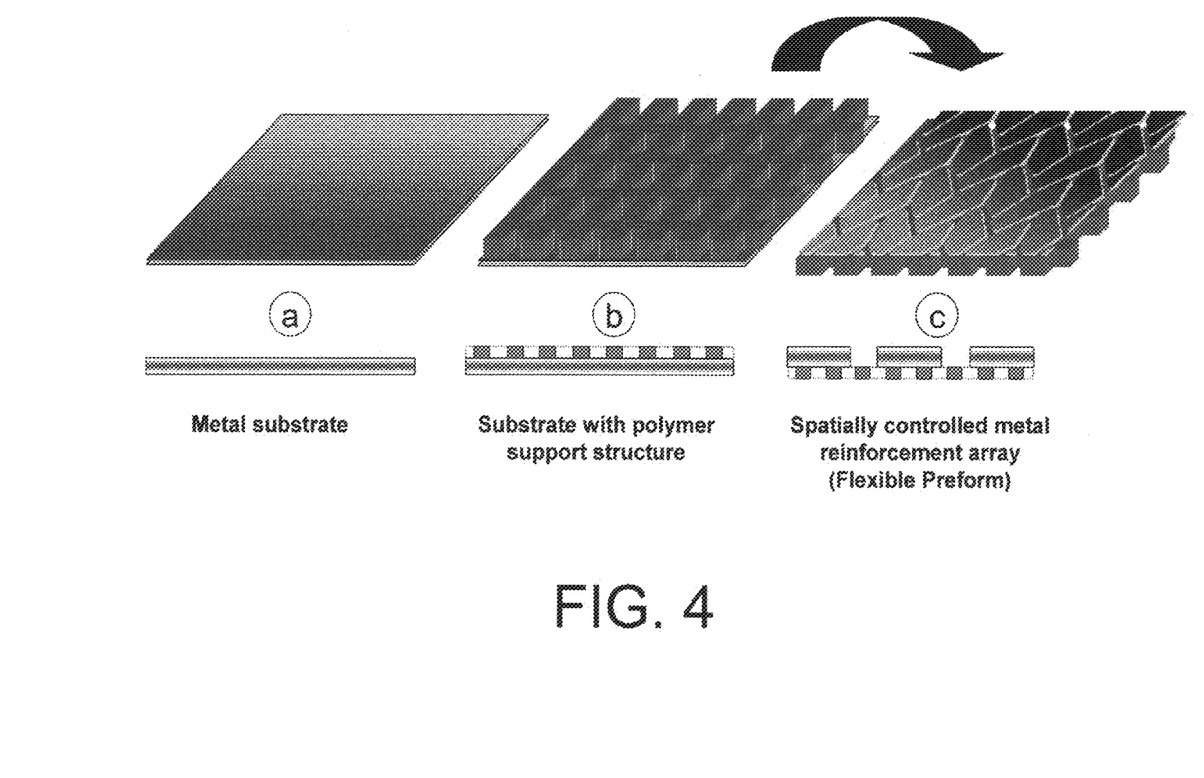
FIG. 4 illustrates a process flow for fabrication of flexible preform with spatially controlled reinforcement elements according to an embodiment of the invention.

FIG. 4 shows a process flow for fabrication of a flexible support that is preformed with spatially controlled reinforcement elements according to an embodiment of the present invention.

In more detail, FIG. 4 shows a method according to one embodiment of the invention that uses a photocurable polymer to create a porous mesh. The requirements for the photosensitive polymer are that it adheres well to the reinforcement material, and that it be flexible and elastic when fully cured. In addition to a number of commercially available materials like polydimethylsiloxane (PDMS) and photocurable urethanes and acrylates, a wide variety of custom, proprietary formulations can be produced to optimize material properties, like adhesion and stiffness, as well as affect process parameters (e.g. to shorten exposure time).

As shown in FIG. 4 and similar to a method as described in U.S. patent application Ser. No. 11/580,335, entitled "OPTICALLY ORIENTED THREE-DIMENSIONAL POLYMER MICROSTRUCTURES," the entire content of which is incorporated herein by reference, in one embodiment of the above described method, a UV-curable adhesive monomer is applied to one side of a sheet of metal as shown in step a. A photomask, containing a mesh pattern, is brought into contact or close proximity with the monomer film. When the film is exposed to an ultraviolet light source, the monomer beneath the clear areas of the photomask solidifies by crosslinking. The excess, unexposed monomer is then removed by solvent cleaning, and the part is post-baked to remove any solvent which might have been absorbed by the polymer. A second UV exposure ensures complete crosslinking. with the support mesh in place on one side of the metal sheet as shown in step b. Then, in step c, the other side of the metal sheet can be masked with the desired platelet pattern and chemically etched to produce the segmented array.

A series of these unit cells can be used to construct a laminate with full 3-D control of the geometric relationship of reinforcement elements. It should be understood that these elements need not necessarily be used for structural reinforcement, but rather could be a variety of objects which require precise spatial positioning within a material such as sensors, communication electronics, energy storage elements, actuators, ornaments, or a combination of components used in multifunctional materials.

Figure 5A:
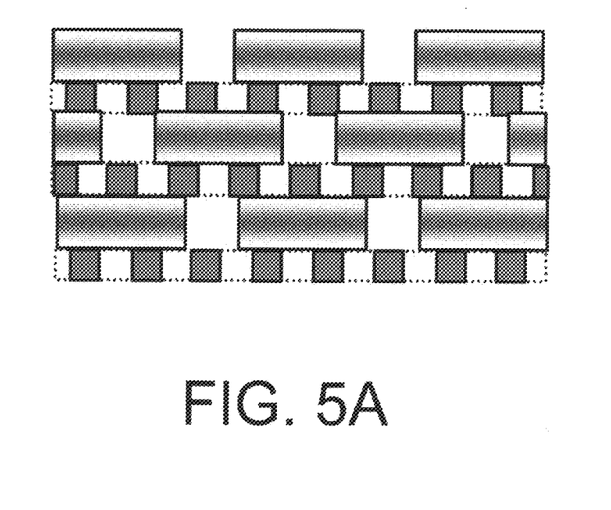
FIG. 5A illustrates assembled material layers and integrated multifunctional to components.
Figure 5B:
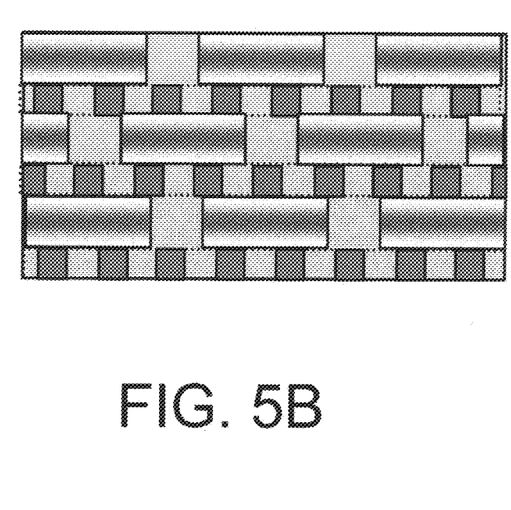
FIG. 5B illustrates an infiltrated and cured matrix material pursuant to aspects of the invention.

FIGS. 5A and 5B illustrates one method of producing a laminate material using the backed, etched sheets. Here, FIG. 5A shows a plurality of material layers (e.g., reinforcement elements (or platelets) 110) that are assembled with multifunctional components (e.g., intermediate support structures 130), and FIG. 5B shows infiltrating (adding) and curing matrix material (or thermosetting material) in the assembled layers to form a multifunctional composite laminate. In FIGS. 5A and 5B, multiple preform sheets are stacked to provide the thickness of the laminate. The number of sheets required and thickness of the overall laminate depend on the specific application but would generally vary from 1 in the case of an embedded functional plane such as a sensor network, to thousands for layers of very thin reinforcements. The thickness of a single patterned and backed layer would generally be between 1 micron and 1 mm, though other dimensions may be suitable for particular applications. As such, a finished part with precision control over dimensions of reinforcement and spatial relationship of reinforcement is formed.

In addition to the exemplary method as described above, several other approaches to creating a polymeric support structure could be utilized which vary in the method of application of the polymer or its precursor to the substrate. Examples include silk screen printing, 3-D inkjet printing and use of a patterned roller, all of which leave a raised pattern of polymer on the substrate surface which, after curing, includes the desired flexible, permeable attached support.

Another embodiment of the support structure utilizes fiber-based materials that can undergo conformal shape changes to accommodate the large strain required in some applications of multifunctional materials. These materials include fine knitted (spandex-type) mesh or non-woven polymeric fabric. These porous fabrics would be attached to the substrate with adhesive or by lamination.

Figure 6:
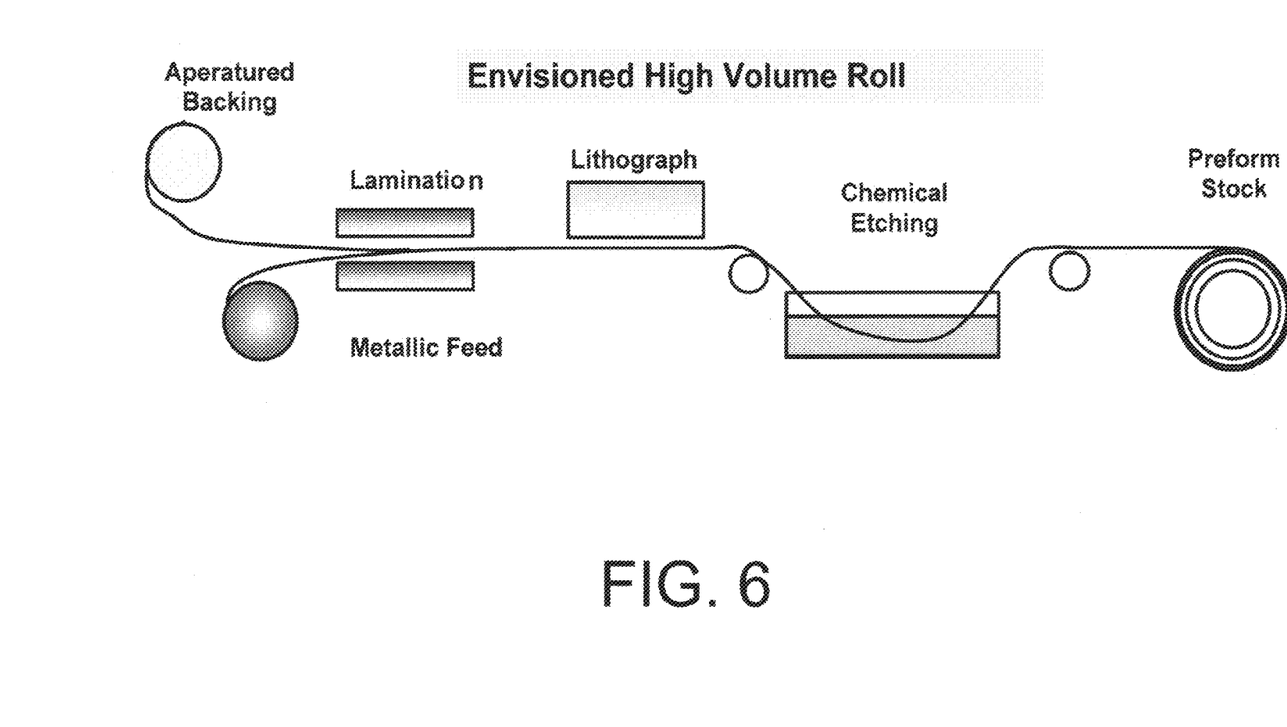
FIG. 6 illustrates a method for creating spatially controlled composite materials incorporating apertured film and lithography according to an embodiment of the invention.

An alternative fabrication method of creating the support structure involves the use of a commercially available or custom made thermoplastic apertured film as described by Hovis and Johnson in U.S. Pat. No. 4,842,794, the entire content of which is incorporated herein by reference. This thermoplastic mesh, properly dimensioned (pore size, land width, thickness) can be laminated to a sheet of the stiff element material prior to etching of the segmented platelet pattern. Referring to FIG. 6, this type of approach can be extended to high volume using a roll fabrication process. Here the end product is a spool of etched material with specific architecture applied to a flexible backing structure. In one embodiment, the process goes as follows. The backing material is laminated to the base structural material which then undergoes a patterning operation. After patterning, an etchant is used to remove unwanted base material, and achieve the desired architecture. This roll of material can then be used similarly to fabric material in fiber composites to make a layup of reinforcement into which resin can be introduced and hardened. Several composite fabrication methods are compatible with this process. These include wet layup where resin is applied to each layer as it is added to the stack, resin infusion methods such as Resin Transfer Molding and Vacuum Assisted Resin Transfer Molding, and spray methods similar to those used in fabricating chopped fiber composites.

Another extension of the technique is to produce "prepreg" type material with specific geometric control of reinforcement or other functional elements. This is useful for other composite processing techniques which use partially cured matrix materials to assist in the layup and consolidation of the composite. The materials can be then cured in heated molds generally with additional pressure to achieve consolidation. This can be achieved by extending the mesh backing process an additional step after the mesh is created. Here a partially cured matrix material such as a thermosetting epoxy is applied to the mesh structure so that it adheres to the mesh and partially fills the voids of the mesh. At the working temperature, this material is generally a solid gel like consistency, and then at elevated cure temperatures becomes fluid and fills in all voids. Further time at high temperature provides complete cure of the polymer. After the matrix is softened, the mesh provides control over the through thickness spacing of the structural elements.

Figure 7:
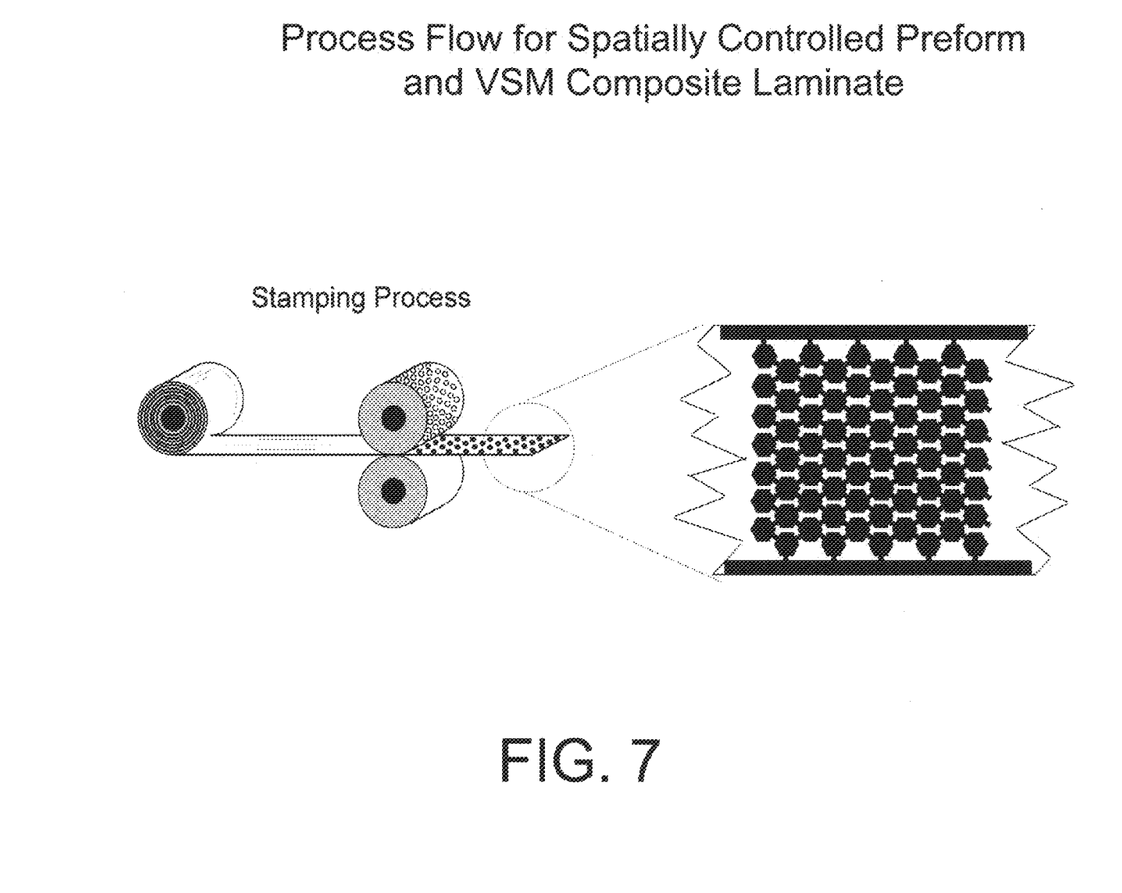
FIG. 7 illustrates a stamping process for producing spatially controlled reinforcement preform according to an embodiment of the invention.

Referring to FIG. 7, yet another method for producing spatially controlled reinforcement structure involves die-cutting and/or stamping of the raw reinforcement material. In this process, a long sheet of metal is passed between two dye rollers, as depicted in FIG. 7, or plates which have the negative of the desired pattern. After the pattern is stamped/die-out on the metal, a reel of supported platelets is produced. This makes the preform for the reinforced shape memory polymer (SMP) composite material. 2-D spatial control of the reinforcement platelets is achieved by the precise manufacturing of the die cutter.

Similar result as the above mentioned stamp/die cutting method can be achieved by use of other machining methods to produce the preform. For example, laser machining, water jet machining, rapid prototyping, and conventional milling machining can produce the preform.

This preform can be processed further to provide for 3-D spatial control of the platelets. In one approach, a second stamping step is performed to make indentations in the platelet reel. Alternatively, drops of a polymer or other material are deposited in certain (or predetermined) positions on the platelet reel. These indentations or deposits are of a prescribed height/thickness. In the manufacture of a composite panel composed of multiple layers of this preform, these indentations or deposits would determine the spacing between the preform layers and thus provide the 3-D spatial control of the reinforcement material in the SMP composite.

Figure 8:
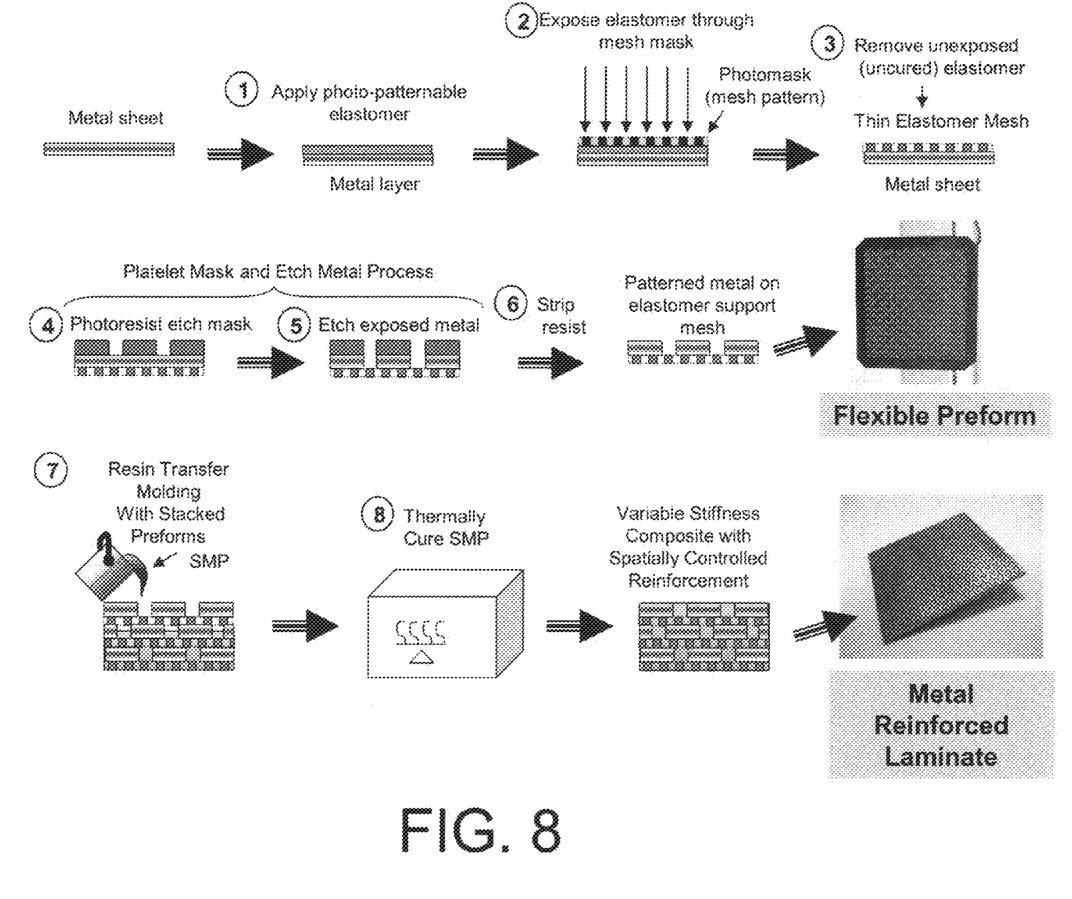
FIG. 8 illustrates a process flow for fabrication of spatially controlled preform and variable stiffness material (VSM) composite laminate according to an embodiment of the present invention.

FIG. 8 illustrates a process flow for fabrication of spatially controlled preform and variable stiffness material (VSM) composite laminate according to an embodiment of the present invention In more detail, FIG. 8 shows that a photo-patternable elastomer (or photosensitive polymer) is applied to a metal sheet in step 1. Here, the requirements for the photosensitive polymer are that it adheres well to the reinforcement material, and that it be flexible and elastic when fully cured. In addition to a number of commercially available materials like polydimethylsiloxane (PDMS) and photocurable urethanes and acrylates, a wide variety of custom, proprietary formulations can be produced to optimize material properties, like adhesion and stiffness, as well as affect process parameters (e.g. to shorten exposure time). In step 2, the applied elastomer (or photosensitive polymer) is then exposed to a light (e.g., a collimated light) through a mask (e.g., a photomask or a mesh mask having a mesh pattern) to cure certain selected (or pre-selected) regions of the elastomer. In step 3, the unexposed (uncured) regions of the elastomer are removed so that a thin elastomer mesh remains on the metal sheet.

A platelet mask and etch metal process is then performed. That is, in step 4, a photoresist etch mask is applied to a surface of the metal sheet that is facing oppositely to (or away from) the surface of the metal sheet where the elastomer is on. Then, in step 5, exposed regions of the metal sheet that are not covered by the photoresist etch mask are then etched to pattern the metal sheet into a patterned metal (e.g., a plurality of reinforcement platelets). In step 6, the photoresist etch mask is stripped from the patterned metal to form a flexible preform (or preform sheet) having the patterned metal on the elastomer support mesh.

Two or more flexible preforms (e.g., three preforms) are then stacked adjacent to one another so that resin (SMP) can be transfer molded with the stacked preforms in step 7. In step 8, the transfer resin (SMP) is cured to form the cured SMP (or thermoset SMP) so that the cured SMP can be properly coupled or adhered to the patterned metal layers (e.g., can be properly adhered to the plurality of reinforcement platelets at certain preset or spatially controlled positions). As such, a metal reinforced laminate having variable stiffness composite with spatially controlled reinforcement is formed in FIG. 8. In FIG. 8, multiple preforms or preform sheets are stacked to provide the thickness of the laminate. The number of sheets required and thickness of the overall laminate depend on the specific application but would generally vary from 1 in the case of an embedded functional plane such as a sensor network, to thousands for layers of very thin reinforcements. The thickness of a single patterned and backed layer would generally be between 1 micron and 1 mm, though other dimensions may be suitable for particular applications.

In addition to the exemplary method as described above, several other approaches to creating a polymeric support structure could be utilized which vary in the method of application of the polymer or its precursor to the substrate. Examples include silk screen printing, 3-D inkjet printing and use of a patterned roller, all of which leave a raised pattern of polymer on the substrate surface which, after curing, includes the desired flexible, permeable attached support.

Another embodiment of the support structure utilizes fiber-based materials that can undergo conformal shape changes to accommodate the large strain required in some applications of multifunctional materials. These materials include fine knitted (spandex-type) mesh or non-woven polymeric fabric. These porous fabrics would be attached to the substrate with adhesive or by lamination.

An embodiment of the present invention is directed to a method for producing highly controlled geometry composite materials with thermoset matrices using a non-structural support material to hold the position of elements during fabrication. In one embodiment, the method uses this support structure to maintain an ordered in three dimension spatially controlled arrangement of reinforcement or other functional materials in a composite.

Embodiments of the present invention are directed to scalable methods to generate the support structure.

One embodiment of the present invention is directed to a process that uses base units and/or pre-pregs with laminated thermoset polymer to create highly controlled materials.

One embodiment of the present invention is directed to a method for forming morphing and variable stiffness materials, but this method also has application for forming multi-functional structural composite materials including, e.g., integrated electronics, sensors, and thermal control elements.

One embodiment of the invention includes the use of specialized architecture varied through the thickness to achieve particular material property goals. For example the spatial distribution can be made to vary through the thickness according to expected application loads. Further specialized layers can be introduced as needed for other multifunctional requirements.

In view of the foregoing, a 3D spatially controlled structural reinforcement according to an embodiment of the present invention is composed of an array of metal platelets whose 2-dimensional (planar) spatial arrangement is maintained by their attachment to a flexible, permeable polymer mesh as the stiff-structural material preform layers and infused thermoset shape memory polymer as the matrix material. Multiple layers of this planar preform are stacked vertically and infused with polymer resin, control over the spatial distribution of the platelets in 3 dimensions is achieved in the resulting composite material.

While certain exemplary embodiments have been described in detail and shown in the accompanying drawings, it is to be understood that such embodiments are merely illustrative of and not restrictive of the broad invention. It will thus be recognized by a person skilled in the art that various modifications may be made to the illustrated and other embodiments of the invention described above, without departing from the broad inventive scope thereof. In view of the above it will be understood that the invention is not limited to the particular embodiments or arrangements disclosed, but is rather intended to cover any changes, adaptations or modifications which are within the scope and spirit of the invention as defined by the appended claims and equivalents thereof.

What is claimed is:

1. A method for fabricating a spatially controlled preform and variable stiffness material composite laminate, the method comprising:
adding and curing a shape memory polymer in a plurality of flexible preforms attached with each other after preforming each of the flexible preforms to form the spatially controlled preform and variable stiffness material composite laminate, wherein the preforming of at least one of the flexible preforms comprises:
applying a supporting material to a first surface of a stiff-structural sheet;
patterning the supporting material applied to the first surface of the stiff-structural sheet;

forming a flexible support on the first surface of the stiff-structural sheet from the patterned supporting material;

patterning a second surface of the stiff-structural sheet, the second surface facing away from the first surface; and forming the at least one of the flexible preforms from the patterned stiff-structural sheet on the formed support.

2. The method of claim 1, wherein the patterning the second surface of the stiff-structural sheet comprises:

applying a photoresist etch mask on the second surface of the stiff-structural sheet to cover a plurality of covered regions on the second surface of the stiff-structural sheet and to expose a plurality of exposed regions on the second surface of the stiff-structural sheet; and etching out the exposed regions on the second surface of the stiff-structural sheet from the second surface of the stiff-structural sheet to the first surface of the stiff-structural sheet.

3. The method of claim 2, wherein the etching out the exposed regions comprises forming a plurality of reinforcement platelets on the formed support from the etched out stiff-structural sheet.

4. The method of claim 3, further comprising:

controlling a precise three-dimensional distribution of the reinforcement platelets distributed in the spatially controlled preform and variable stiffness material composite laminate through the formed support.

5. The method of claim 1, wherein the applying the supporting material to the first surface of the stiff-structural sheet comprises applying a photo-patternable elastomer to the first surface of the stiff-structural sheet.

6. The method of claim 5, wherein the patterning the supporting material applied to the first surface of the stiff-structural sheet comprises exposing the applied photo-patternable elastomer to a light through a mask to cure selected regions of the elastomer.

7. The method of claim 6, wherein the forming the flexible support on the first surface of the stiff-structural sheet from the patterned supporting material comprises removing uncured regions of the elastomer.

8. The method of claim 1, wherein the forming the flexible support on the first surface of the stiff-structural sheet comprises forming a thin elastomer mesh on the first surface of the stiff-structural sheet from the patterned supporting material.

9. The method of claim 1, wherein the adding and curing the shape memory polymer in the plurality of flexible preforms comprises adding and curing a thermosetting material in the plurality of flexible preforms attached with each other.

10. The method of claim 1, wherein the adding and curing the shape memory polymer in the plurality of flexible preforms comprises concurrently curing the shape memory polymer in the plurality of flexible preforms to ensure a proper adherence of the shape memory polymer to the plurality of flexible preforms.

11. The method of claim 1, wherein the plurality of flexible preforms comprises at least three layers of flexible preforms.

12. The method of claim 1, wherein the stiff-structural sheet comprises a constant stiffness material.

13. The method of claim 1, wherein the stiff-structural sheet is a metal sheet.

14. The method of claim 13, wherein the metal sheet comprises a material selected from the group consisting of aluminum, steel, titanium, and combinations thereof.

15. The method of claim 1, wherein the shape memory polymer comprises a material selected from the group consisting of epoxy, vinyl ester, polyester, polyester variants, and combinations thereof.

16. A method for fabricating a spatially controlled preform and variable stiffness material composite laminate, the method comprising:

adding and curing a thermosetting material in a plurality of flexible preforms attached with each other after preforming each of the flexible preforms to form the spatially controlled preform and variable stiffness material composite laminate, wherein the preforming of at least one of the flexible preforms comprises:

applying an elastomer to a first surface of a metal sheet;

patterning the elastomer applied to the first surface of the metal sheet;

forming a support mesh on the first surface of the metal sheet from the patterned elastomer;

patterning a second surface of the metal layer, the second surface facing away from the first surface; and forming the at least one of the flexible preforms from the patterned metal sheet on the formed support mesh.

17. The method of claim 16, further comprising:

controlling a precise three-dimensional distribution of the patterned metal sheet distributed in the spatially controlled preform and variable stiffness material composite laminate through the formed support mesh.

18. The method of claim 1, wherein the applying the supporting material to the first surface of the stiff-structural sheet comprises applying an ultraviolet-curable adhesive monomer to the first surface of the stiff-structural sheet.

19. The method of claim 18, wherein the patterning the supporting material applied to the first surface of the stiff-structural sheet comprises exposing the ultraviolet-curable adhesive to a collimated ultraviolet light through a mask, having a mesh pattern, to cure and polymerize selected regions of the monomer.

* * * * *